United States Patent
Yang et al.

(10) Patent No.: US 9,628,593 B2
(45) Date of Patent: Apr. 18, 2017

(54) CARD TRAY FOR ELECTRONIC DEVICE AND TRAY CARRIER ASSEMBLY USING THE SAME

(71) Applicant: Molex, LLC, Lisle, IL (US)

(72) Inventors: In Chull Yang, Ansan (KR); Jeong Yong Park, Ansan (KR)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/000,177

(22) Filed: Jan. 19, 2016

(65) Prior Publication Data

US 2016/0227661 A1    Aug. 4, 2016

(30) Foreign Application Priority Data

Feb. 3, 2015 (KR) .......................... 10-2015-0016951

(51) Int. Cl.
*H04M 1/02* (2006.01)
*H05K 5/02* (2006.01)
*H04B 1/3816* (2015.01)

(52) U.S. Cl.
CPC .......... *H04M 1/026* (2013.01); *H04B 1/3816* (2013.01); *H05K 5/0286* (2013.01)

(58) Field of Classification Search
CPC .. H05K 5/0286; H05K 5/0291; H05K 5/0295; H05K 5/0217; G06K 7/0021; G06K 13/08; H04M 1/026; H04B 1/3816
USPC ...................................................... 211/41.12
See application file for complete search history.

(56) References Cited

U.S. PATENT DOCUMENTS

| 8,021,175 B2* | 9/2011 | Kim | G06K 7/0021 439/159 |
| 8,439,696 B2* | 5/2013 | Zhou | G06K 13/08 439/188 |
| 2010/0234070 A1* | 9/2010 | Li | G06K 7/0021 455/558 |

FOREIGN PATENT DOCUMENTS

| JP | 2002-298092 A | 10/2002 |
| JP | 2013-222629 A | 10/2013 |
| JP | 2013-222631 A | 10/2013 |
| KR | 10-1460076 B1 | 11/2014 |
| KR | 10-1468952 B1 | 12/2014 |

* cited by examiner

*Primary Examiner* — Korie H Chan
(74) *Attorney, Agent, or Firm* — James A. O'Malley

(57) ABSTRACT

A card tray for use in electronic devices is disclosed that can improve tray durability, eliminate the occurrence of resin flash during insert molding, and simplify the tray mold structure. The card tray for electronic devices according to a preferred embodiment may be a card tray for electronic device use for insertion into and withdrawal from a card socket of an electronic device with a card loaded thereon, comprising a tray body made of a nonmetallic material whereon is formed a card mounting hole or mounting recess for mounting the card, and a metal frame part that is coupled to the tray body so that the cross section protrudes from the front of the tray body.

7 Claims, 12 Drawing Sheets

CARD TRAY FOR ELECTRONIC DEVICE AND TRAY CARRIER ASSEMBLY USING THE SAME

RELATED APPLICATIONS

This application claims priority to Korean Application No. 10-2015-0016951, filed Feb. 3, 2015, which is incorporated herein by reference in its entirety.

TECHNICAL FIELD

This disclosure relates to a card tray, and more specifically, to a card tray for use in an electronic device for inserting and withdrawing a tray on which a card is mounted.

BACKGROUND ART

Generally, in electronic devices such as smartphones in which various cards (memory cards or SIM cards) are mounted, for convenience of use, the cards are loaded onto a tray for insertion and extraction.

The card trays of the prior art are classified as metal processed trays, e.g. CNC-machined or metal powder injection molded trays, and plastic injection molded trays.

TABLE 1

| Category | Processing method | Material | Price | Strength | Thickness | Size |
|---|---|---|---|---|---|---|
| Metal processed tray | CNC machining | Aluminum | High | Medium | Thin | Medium |
| | Metal injection molding | Stainless steel | High | Strong | Thin | Small |
| Plastic tray | Injection molding | Plastic | Low | Weak | Thick | Large |

As shown in Table 1, metal processed trays are expensive, while plastic trays have the disadvantages of being both weak and large.

In particular, in the case of a card tray made of plastic material, because it is weaker than metal materials, the front end part of the card tray, which contacts the ejecting hinge part, can be deformed or damaged by repeated impacts that occur when the tray is pulled from the card socket; in addition, damage may also occur to the plastic parts of the tray due to friction with the metallic parts or parts made of other materials in the insertion/extraction process.

In addition, the occurrence of resin flash after plastic injection molding is a cause of reduced yield, and to eliminate flash, the tray mold structure must be made more complex, causing a problematic reduction in productivity.

(Patent Reference 0001) Korean Registered Patent Gazette No. 10-1460076 (2014.11.20)

(Patent Reference 0002) Korean Registered Patent Gazette No. 10-1468952 (2014.12.04)

SUMMARY

The technical task of this disclosure is to provide a card tray for electronic devices that can increase tray durability due to the tray being made of a dual material wherein a metal frame is insert-molded into plastic.

Another technical task of the disclosure is to provide a card tray for electronic devices that can simplify the tray mold structure and eliminate the occurrence of resin flash during insert molding.

A further technical task of the disclosure is to provide a tray carrier assembly to mount and carry a card tray as described above on an inline carrier.

The card tray for electronic devices according to a preferred embodiment of this disclosure, in order to achieve the above tasks, may be a card tray for insertion into and withdrawal from a card socket of an electronic device with a card loaded thereon, comprising: a tray body made of a nonmetallic material whereon is formed a card mounting hole or mounting recess for mounting said card; and a metal frame part that is coupled to said tray body so that the cross section protrudes from the front of said tray body.

Further, said metal frame part may comprise: a frame body insert molded on said tray body; a front-protruding frame that protrudes from the front surface of the front end part of said tray body; and a side-protruding frame the cross section of which protrudes to either side of the front end part of said tray body and is formed as a unit with either side of said front-protruding frame.

In addition, said metal frame part may have a cross-sectional shape identical to the cross section of the front end part of said tray body, and may be located on at least one of the top, middle, and bottom of the cross section of the front end part of said tray body.

In addition, said metal frame part may protrude from all surfaces of at least one of the interior or exterior of said tray body.

In addition, said metal frame part does not contact said card due to said tray body of nonmetallic material, and due to the insulation between said metal frame part and said card, it is not necessary to separately apply a nonconductive coating to said metal frame part.

In addition, in order to achieve said technical task, the tray carrier assembly according to a preferred embodiment of this disclosure may comprise: said card tray; and a carrier body whereon is formed a tray mounting hole or mounting recess whereon said card tray is mounted, while a tray connecting part is formed protruding toward the interior of said tray mounting hole or mounting recess, so that it connects to the metal frame part protruding from the front end part of said card tray, or connects to the area where the handle part and card mounting part of said card tray couple together.

The card tray for electronic devices of this disclosure, and the tray carrier assembly using the same, have the following effects.

First, by making card trays of dual components wherein a metal frame part of a metal material is insert molded onto a tray body of plastic material, this disclosure can reduce the size and increase the durability of trays compared to the existing card trays made of plastic alone; and also affords a lower price than existing card trays made of a metal material.

Second, by making the high-strength metal frame part protrude from the front end part of the tray body, this disclosure can prevent damage (denting, cracking, wear, breakage) of plastic material parts of the card tray caused by friction with parts made of metal or other materials in the tray insertion/extraction process, and by this means can prevent tray insertion/extraction defects that can occur due to tray damage during tray insertion/extraction.

Third, by exposing the metal frame part through protrusion from the front end part of the tray body, resin flash during insert molding can be eliminated, thus increasing product yield, and tray mold structures for improved productivity can be simplified, thereby simplifying the fabrication and maintenance of the molds.

Fourth, with regard to the structure connecting the tray to the inline carrier, this disclosure enables changing the location of the tray connecting part in accordance with the elimination or maximization of the tray handle area, and allows automation of the manufacturing process by means of mounting the tray on the inline carrier.

DETAILED DESCRIPTION OF THE PREFERRED EMBODIMENTS

Figure 1:
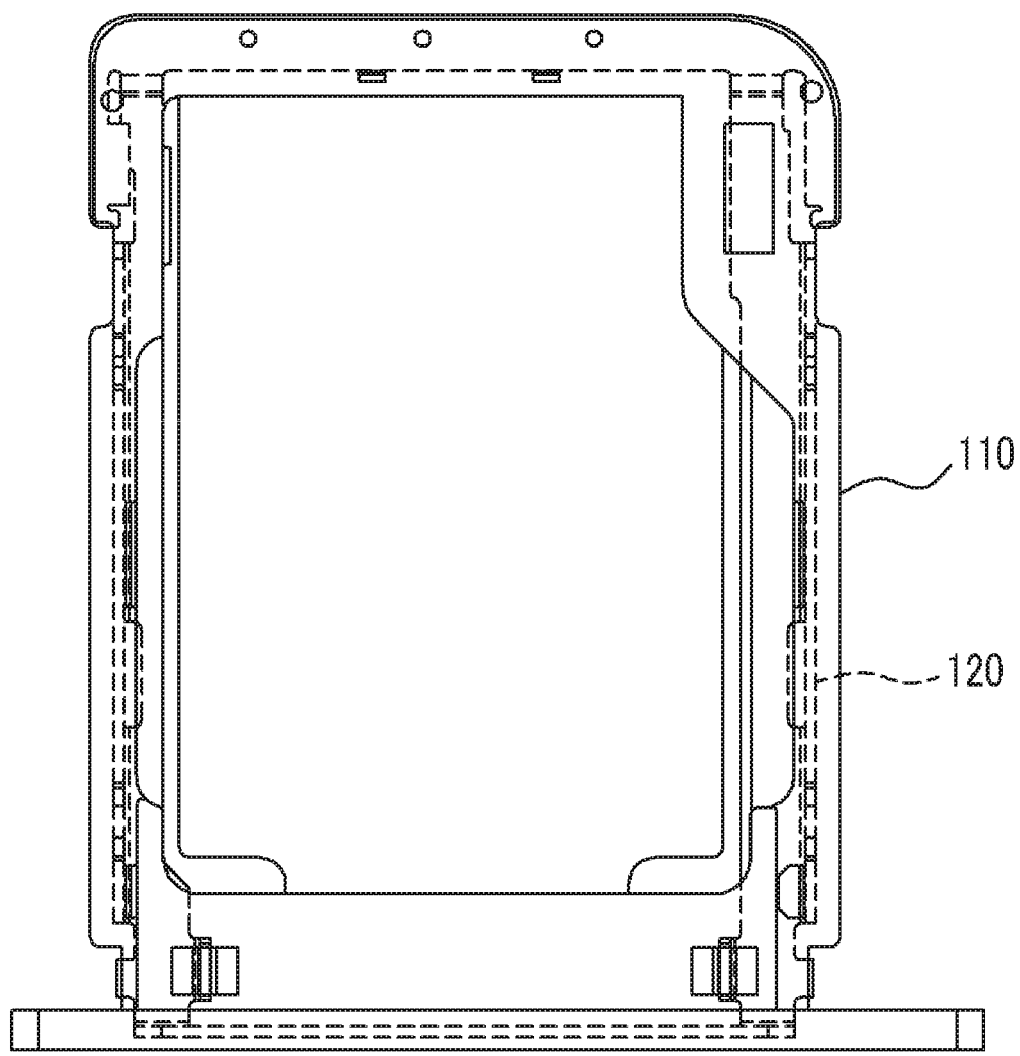
FIG. 1 is a top view of the card tray for electronic devices according to a preferred embodiment of this disclosure.
Figures 2A, 2B:
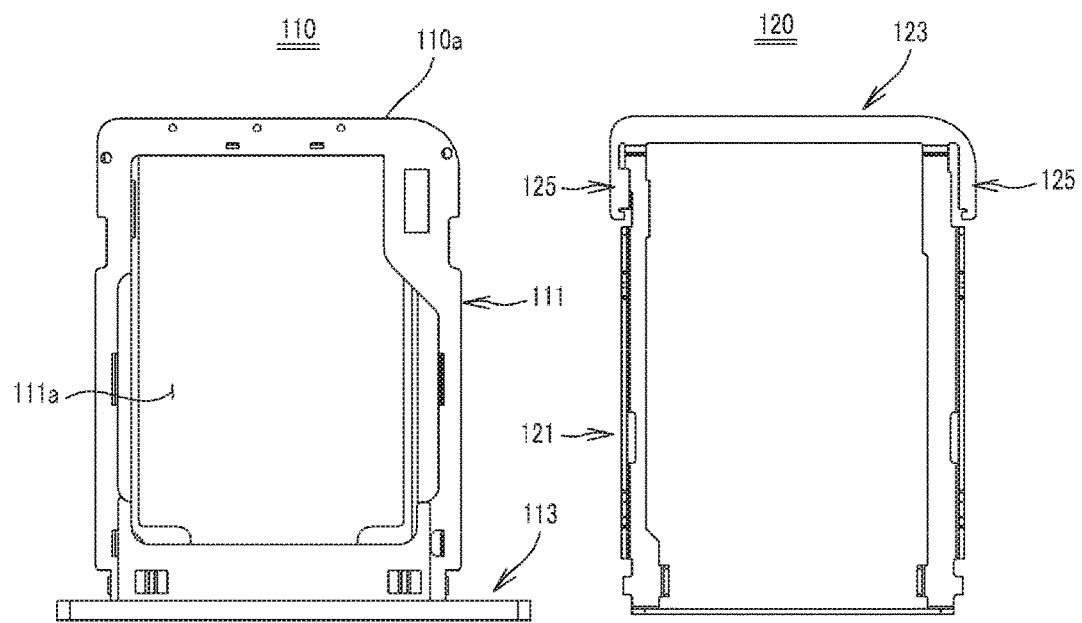
FIGS. 2A and 2B are top views of a tray body and metal frame part, respectively, that make up the card tray for electronic devices according to a preferred embodiment of this disclosure.
Figure 3:
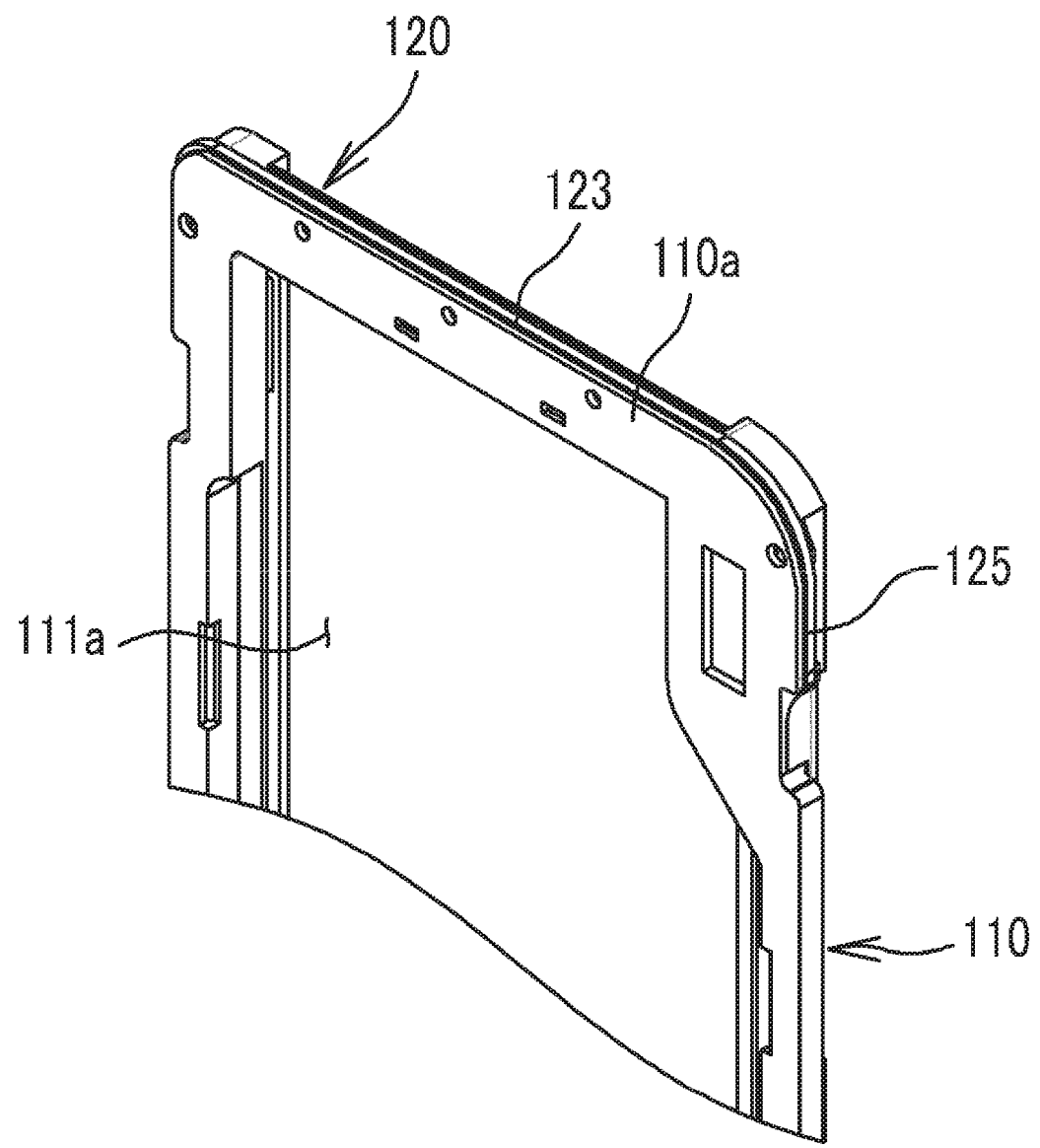
FIG. 3 is an enlarged view of the front end part of the card tray of this disclosure.

Hereinbelow, a card tray for electronic device use and a tray carrier assembly using the same, according to a preferred embodiment of this disclosure, are described in detail with reference to the attached drawings. Please note that in describing this disclosure, the detailed explanation is omitted of functions and components which are common knowledge and are judged to unnecessarily obscure the core intent of the disclosure.

As shown in FIGS. 1, 2A, 2B and 3, the card tray for electronic devices 100 according to a preferred embodiment of this disclosure may comprise a tray body 110 and metal frame part 120.

The tray body 110 includes a card mounting part 111 having an overall rectilinear shape, with a card mounting hole 111a or mounting recess whereinto the card 1 (see FIG. 5) is inserted and mounted, and a handle part 113 formed on the card mounting part 111 so that when inserting/extracting the card tray 100 in the card socket 10 (see FIG. 5), it can be gripped and pushed or pulled by hand. When the tray body 110 is inserted into the card socket 10, the card mounting part 111 is inserted into the tray insertion path and the handle part 113 is positioned at the entrance to the tray insertion path.

In addition, the tray body 110, when inserted in the card socket 10, is either formed with a structure such that it does not make electrical contact with the various terminals of the card socket 10, or is made of a nonconductor, for example a nonmetallic material such as plastic.

The metal frame part 120 is coupled to the tray body 110 so that its cross section protrudes from the front end part 110a of the tray body 110. This structure is formed so that the cross-section of the metal frame part 120 protrudes from the front end part 110a of the tray body 110 and is exposed, in order to simplify mold structure to improve productivity when insert-molding the metal frame part 120 on the tray body 110, and to eliminate factors that lead to lower yield through e.g. the occurrence of flash. The metal frame part 120 is made of a metal material in order to enhance tray strength (and durability).

Accordingly, because the card tray 100 of this disclosure has a dual-element configuration wherein the metal frame part 120 made of a metal material being insert molded on the tray body 110 made of a plastic material, its strength can be increased and its size can be reduced beyond what is possible with existing card trays made of plastic material only; and in addition, the cost is approximately ⅓ less than existing card trays made of metal material only.

The metal frame part 120 includes a frame body insert-molded on said tray body 110, a front-protruding frame 123 that is formed as a single unit with the front end part of the frame body 121 and protrudes from the front surface of the front end part 110a of the tray body 110, and a side-protruding frame 125 the cross section of which protrudes from either side of the front end part 110a of the tray body 110 and is formed as a single unit with either side of the front-protruding frame 123.

Figure 4A:
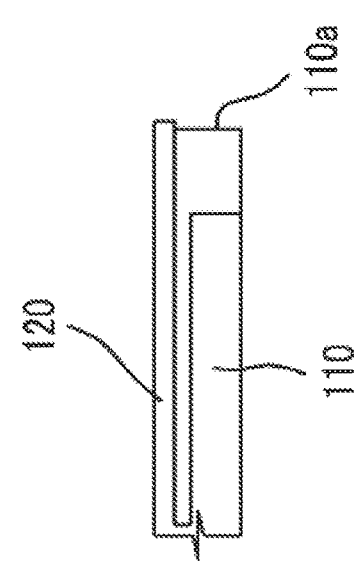
FIGS. 4A, 4B and 4C show diverse implementations of the cross-sectional shape and position of the metal frame that protrudes from the front end part of the tray body.
Figure 4B:
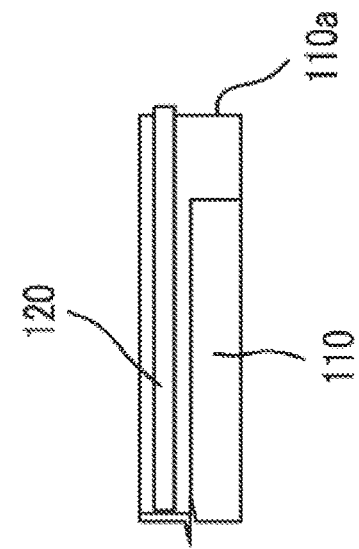
Figure 4C:
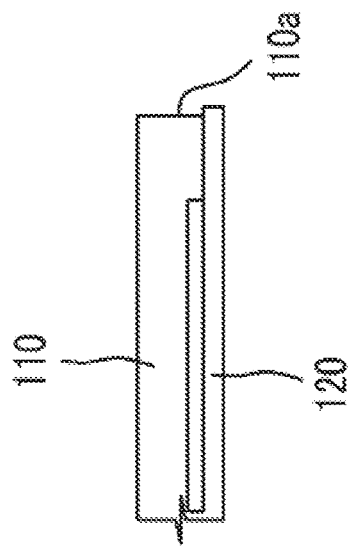

As shown in FIGS. 4A, 4B and 4C, the metal frame part 120 has a shape identical to the cross section of the front end part 110a of the tray body 110. In this embodiment, a configuration is illustrated wherein the front end part 110a of the tray body 110 has a rectilinear cross section, and the metal frame part 120 is correspondingly formed to protrude with a rectilinear cross section; but this is not limiting, and if the front end part 110a of the tray body 110 has a curvilinear cross section, the metal frame part 120 may accordingly be formed to protrude with a curvilinear cross section.

In addition, the protruding cross section of the metal frame part 120 may be located on at least one of the top (FIG. 4A), middle (FIG. 4B), or bottom (FIG. 4C) of the cross section of the front end part 110a of the tray body 110.

The advantages that can be obtained by this disclosure, as a result of the metal frame part 120 being configured to protrude from the front end part 110a of the tray body 110, are described hereinbelow with reference to FIGS. 6, 7, 8A, 8B, 9A and 9B.

Figure 5:
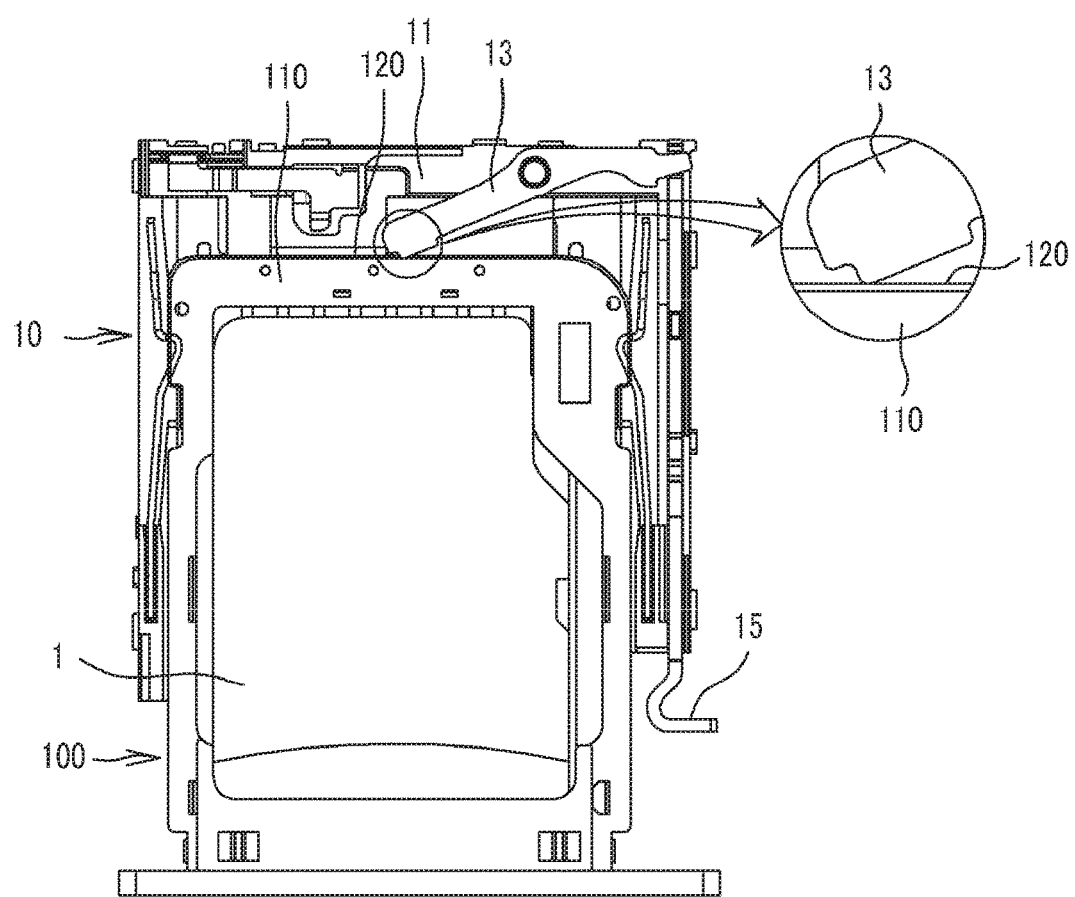
FIG. 5 shows the functionality of preventing product deformation due to repeated impact on the ejecting hinge part, due to the metal frame part being configured to protrude from the front end part of the tray body.

As shown in FIG. 5, the card tray 100 uses the principle of the lever in order to extract the card tray 100 from the card socket 10. To this end, the by applying force via an ejecting load part 15 on one end of the ejecting hinge part 13 the central axis whereof is fixed to the socket housing 11, the force is communicated to the far end of the ejecting hinge part 13, and the far end of the ejecting hinge part 13 comes into contact with the front end part of the card tray 100 so that the card tray 100 is extracted. However, if this action is repeated, the front end part of the card tray 100 that contacts the ejecting hinge part 13 becomes unable to perform tray-related functionality due to being deformed or damaged by repeated impacts. Accordingly, by having the high-strength metal frame part 120 protrude from the front end part 110a of the tray body 110, the card tray 100 is protected from the repeated shock caused by the ejecting hinge part 13, and thus can maintain its functionality related to tray extraction.

Figure 6:
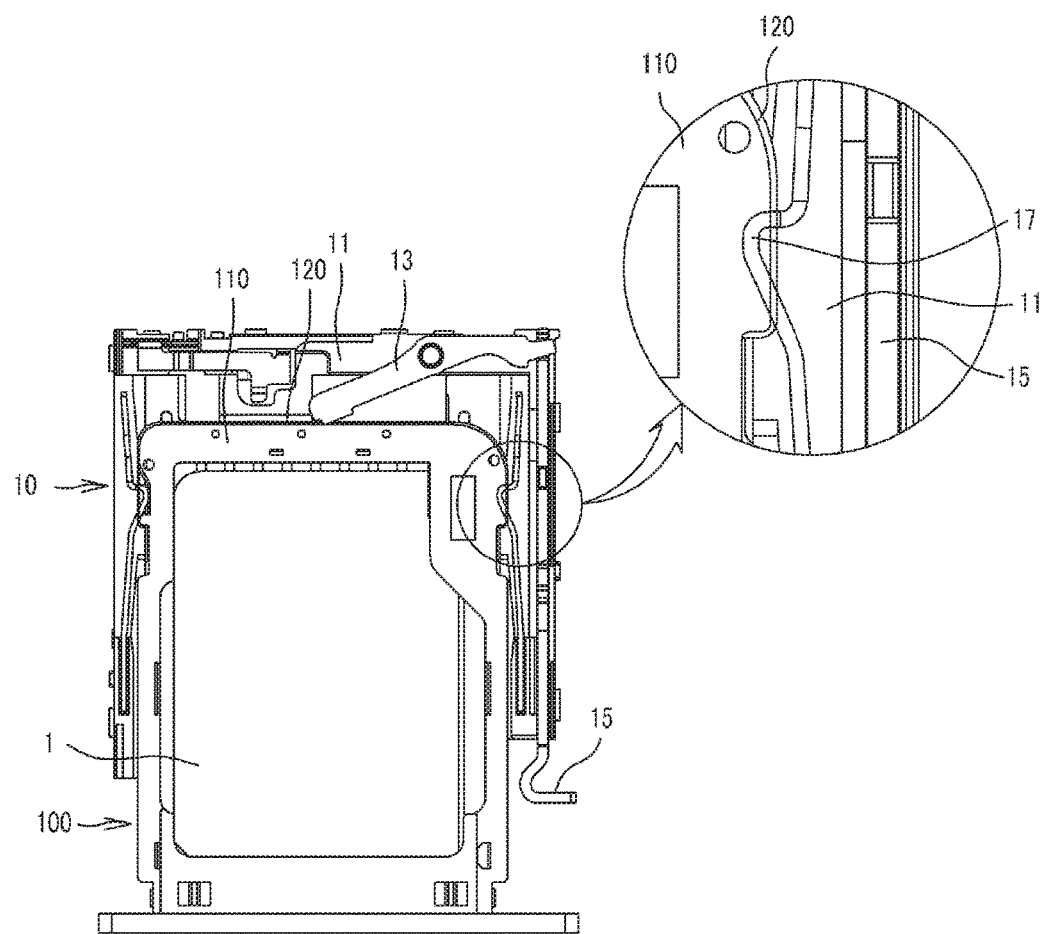
FIG. 6 shows the functionality of preventing tray extraction defects due to tray damage caused by the latch hook when inserting/extracting the tray, due to the metal frame part being configured to protrude from the front end part of the tray body.

As shown in FIG. 6, by making the metal frame part 120 protrude from the front end part 110a of the tray body 110, the damage (denting, cracking, wear, breakage) of the plastic part of the card tray 100 caused by friction with metal parts or parts of other materials, such as the latch hook 17, can be prevented, and by this means, the tray insertion/extraction defects that can occur due to tray damage during tray insertion/extraction can be prevented.

Figure 7:
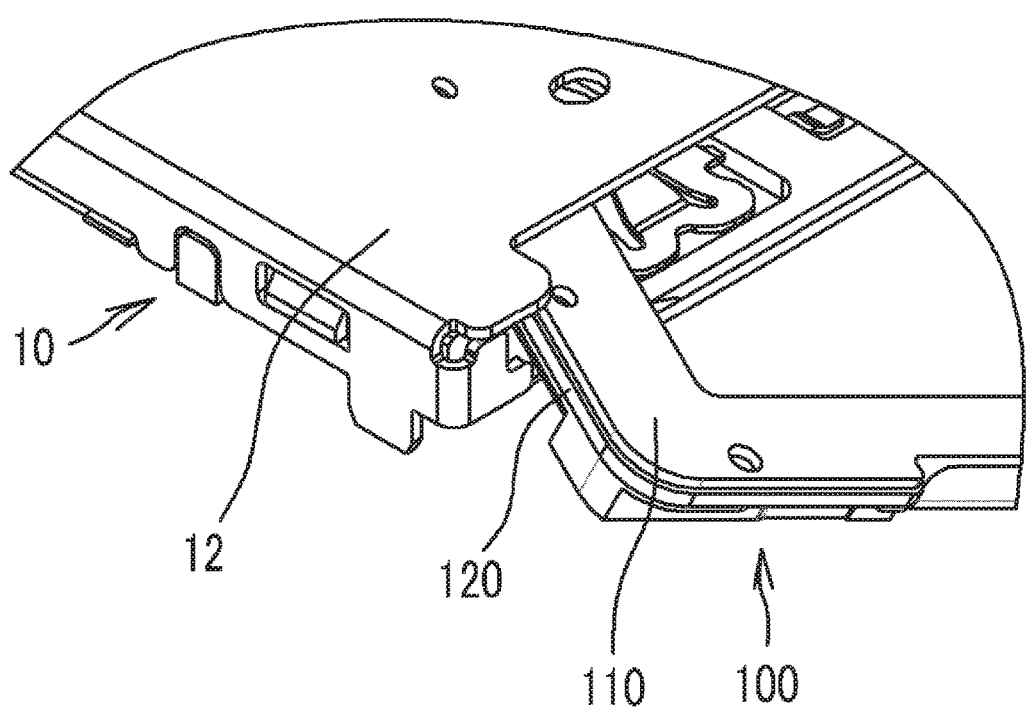
FIG. 7 shows the functionality of preventing tray damage caused by collisions between the tray corners and card socket when inserting the tray into the card socket at an angle, due to the metal frame part being configured to protrude from the front end part of the tray body.

As shown in FIG. 7, by configuring the metal frame part 120 to protrude from the front end part 110a of the tray body 110, damage caused by collision between the corners of the tray and the metal shell 12 of the card socket 10 when the card tray 100 is inserted at an angle into the card socket 10 can be prevented by the metal frame part 120.

In addition, by adopting a configuration in which the cross section of the metal frame part 120 protrudes from the front end part of the card tray 100, this disclosure can increase productivity by simplifying the mold structure and can also eliminate a factor causing yield reduction due to flash. This will be explained in detail with reference to FIGS. 8A, 8B, 9A and 9B.

Figure 8A:
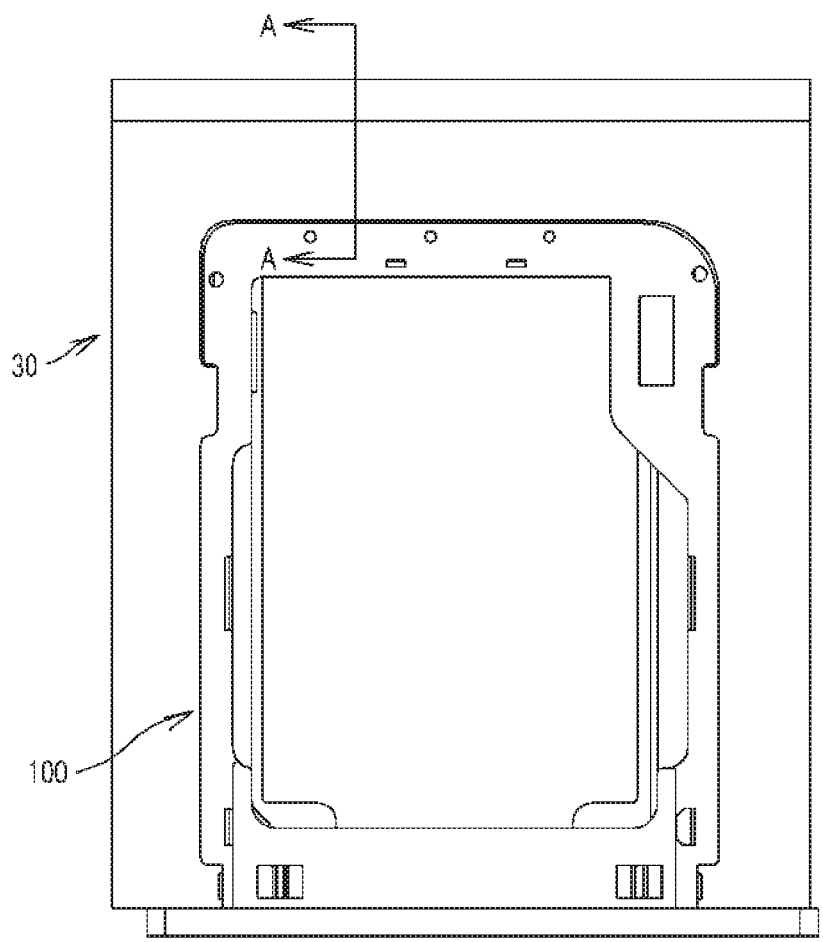
FIGS. 8A and 8B show an example of a mold configuration when the front end part of the tray body and front end part of the metal frame part are matched.
Figure 8B:
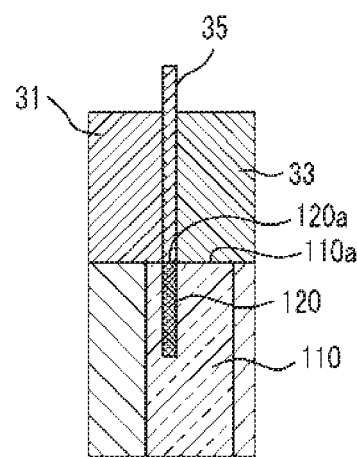

As shown in FIGS. 8A and 8B, because the cut away cross-section of the metal frame is lumpy rather than consistent, there is a risk of flash occurring after molding; in order to eliminate the occurrence of flash due to the irregular and curvilinear properties of this cross-section, when the front end part 120a of the metal frame part 120 matches up with the front end part 110a of the tray body 110, the configuration of the tray mold 30 additionally involves not only an upper metal part 31 and lower metal part 33 but also a slide mold part 35.

The metal frame part 120 is surrounded by the upper metal part 31, lower metal part 33, and slide mold part 35; the plastic resin that makes up the tray body 110 is formed into a tray shape as it is introduced between the contact surfaces of the respective mold parts.

Figure 9A:
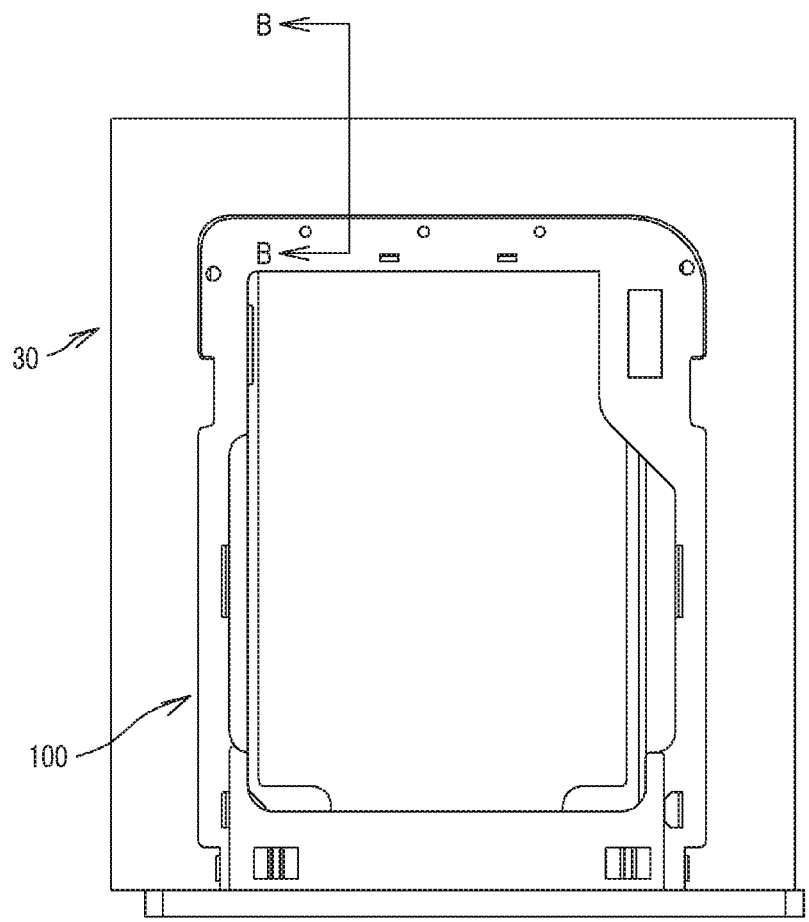
FIGS. 9A and 9B show an example mold configuration when the metal frame part protrudes from the front end part of the tray body.
Figure 9B:
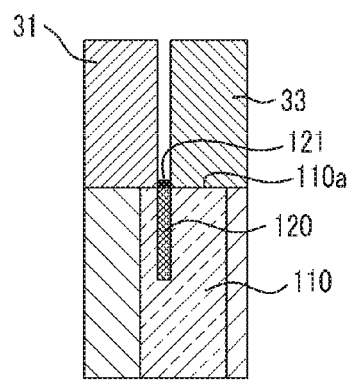

As shown in FIGS. 9A and 9B, the configuration of the tray mold 30, when the metal frame part 120 protrudes from the front end part 110a of the tray body 110, comprises a top mold part 31 and a bottom mold part 33.

Interposed between the top mold part 31 and bottom mold part 33 is the protruding cross section 121 of the metal frame part 120 that protrudes from the front end part 110a of the tray body 110 made of plastic material; the interior of the mold 30 is filled with a plastic resin that forms the tray body 110, and the protruding cross section 121 of the metal frame part 120 is blocked off by the top mold part 31, bottom mold part 33, and protruding cross section of the metal frame part 120, so that the plastic resin cannot enter; as a result, flash does not occur. Accordingly, because the cause of flash defects can be eliminated, product yield can be improved and the slide mold part 35 for preventing flash can be eliminated; thus, a simplification in mold structure can also be achieved.

Specifically, the when the metal frame part 120 is exposed protruding from the front end part 110a of the tray body 110, the number of mold 30 parts needed to form the relevant shape can be reduced from three (top mold part 31, bottom mold part 33, slide mold part 35) to two (top mold part 31, bottom mold part 33), thereby simplifying mold fabrication and maintenance.

Figure 10:
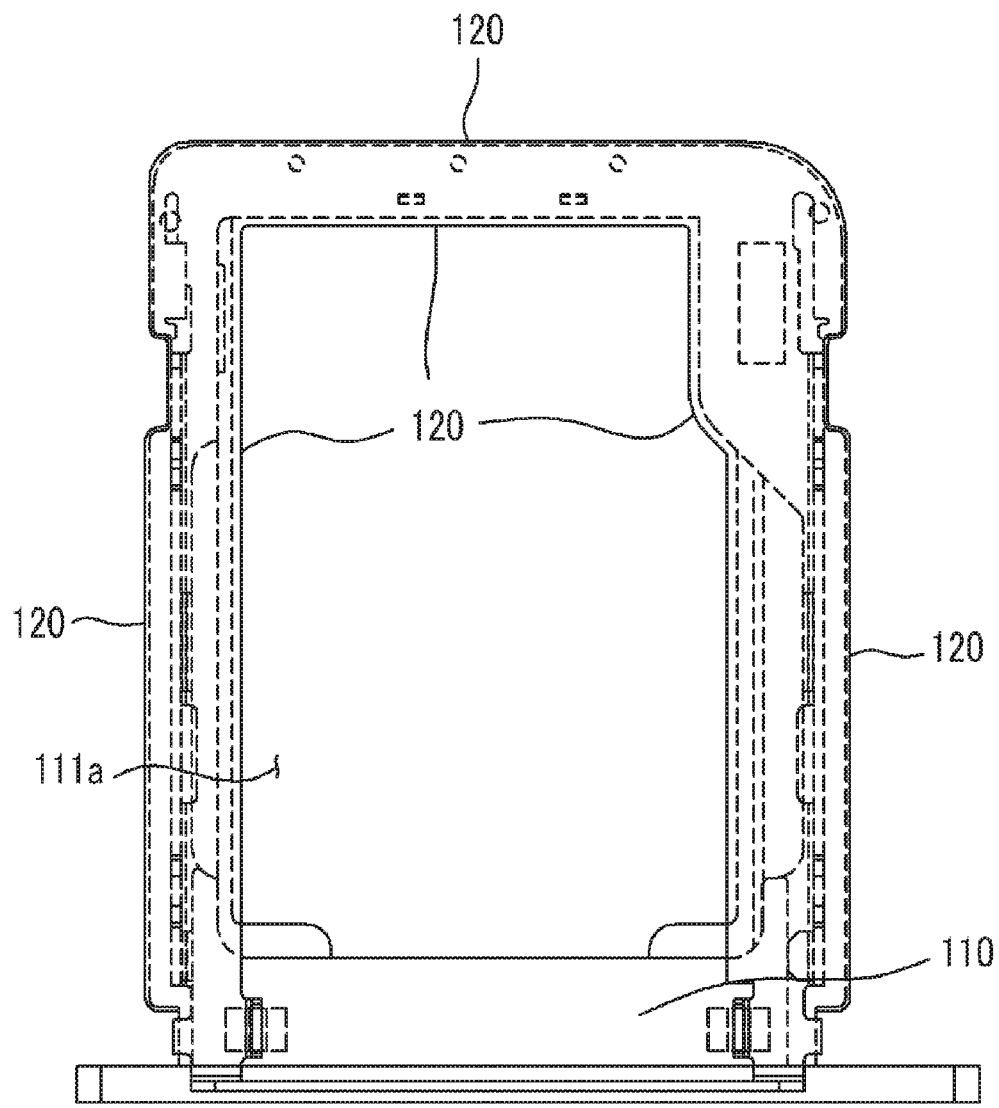
FIG. 10 shows an embodiment wherein the metal frame part protrudes in a forward direction from the tray body.

As shown in FIG. 10, the metal frame part 120 can also be implemented to protrude from all surfaces of at least one of the interior and exterior of the tray body 110. For example, the metal frame part can be made to protrude outward from the left surface, right surface, and back surface of the tray body 110, or can be made to protrude inward from the metal frame part 120 along the card mounting hole 111a or mounting recess of the tray body 110.

Figure 11A:
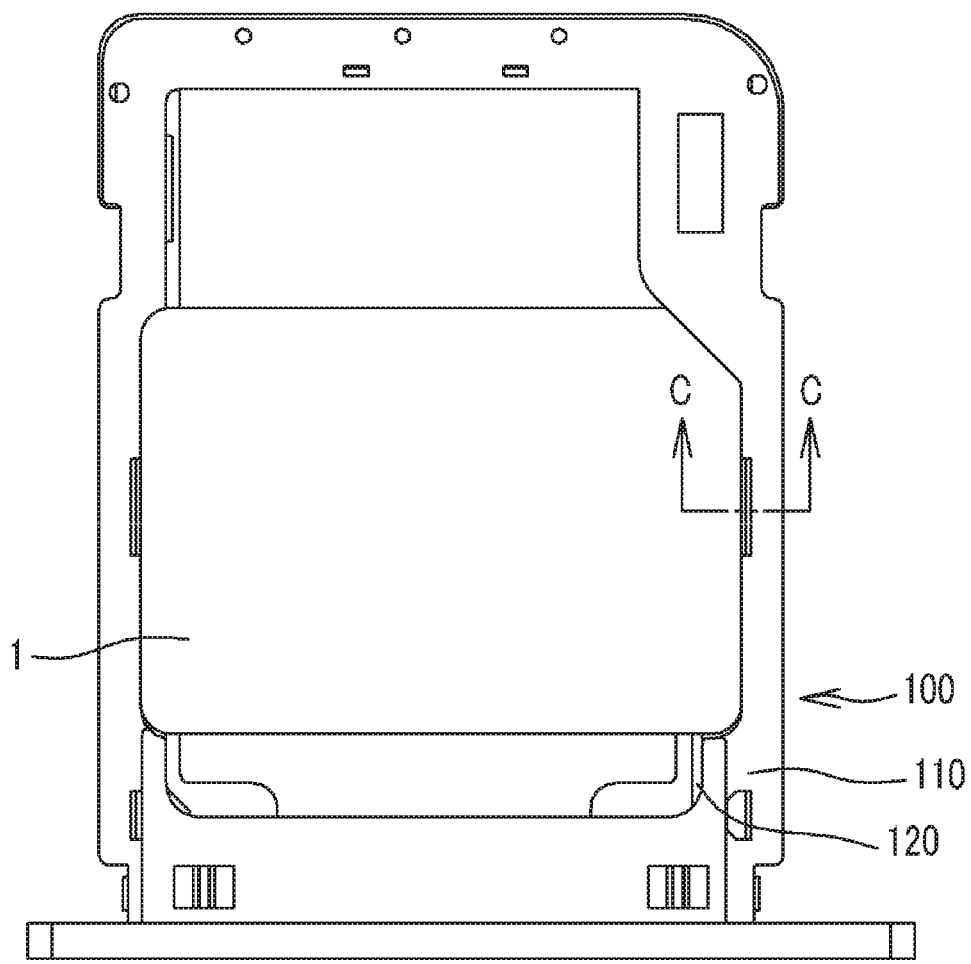
FIGS. 11A and 11B show a structure wherein the metal frame part and card are insulated from one another by the plastic tray body.
Figure 11B:
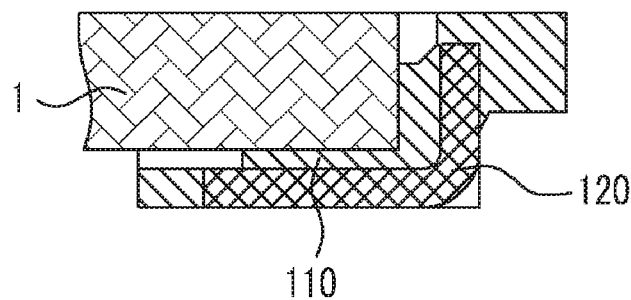

As shown in FIGS. 11A and 11B, the metal frame part 120 does not contact the card 1, due to the plastic tray body 110. Accordingly, while in the case of existing metal trays, it has been necessary to apply a separate insulative coating to the metal tray surface to insulate the tray from the mounted card, in this disclosure, a separate nonconductive coating on the metal frame part 120 is not necessary, because of the insulation provided by the plastic resin between the metal frame part 120 and the card 1.

Figure 12A:
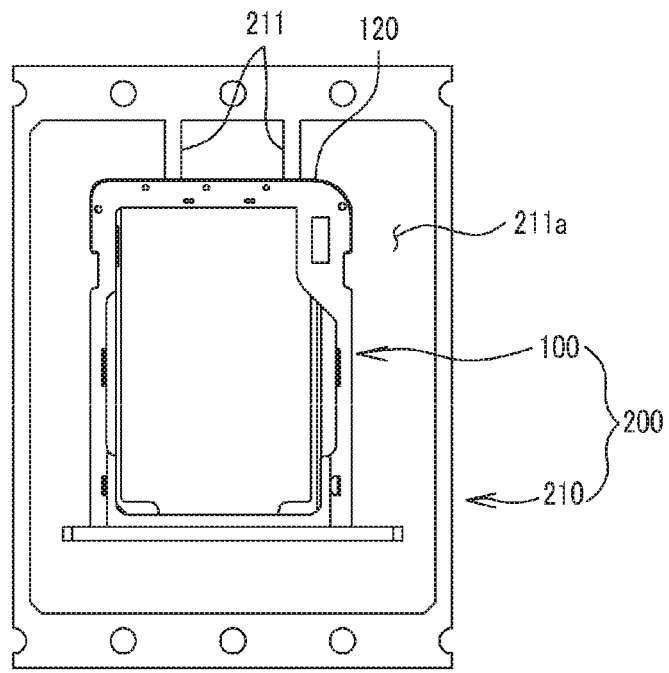
FIGS. 12A and 12B show an embodiment of a tray carrier assembly using a card tray according to a preferred embodiment of this disclosure.
Figure 12B:
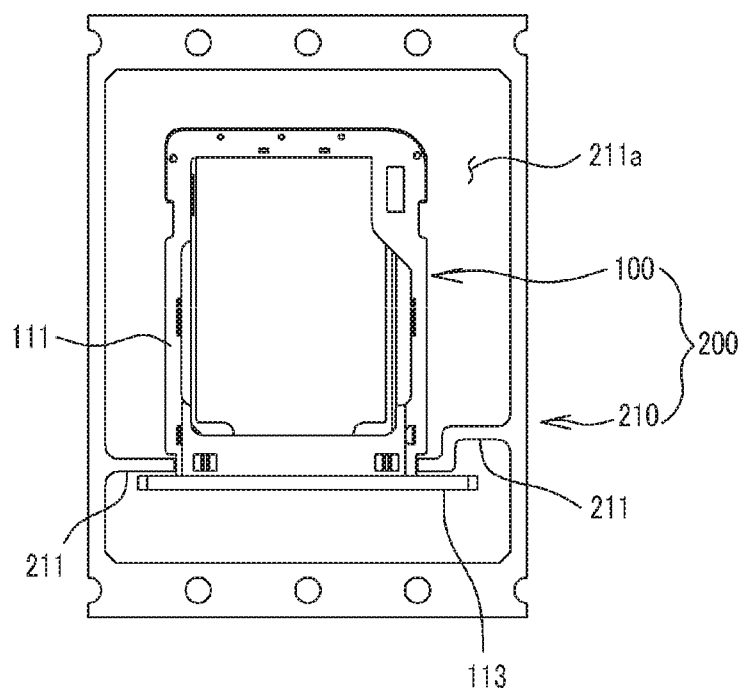

As shown in FIGS. 12A and 12B, the tray carrier assembly 200 serves to carry the card tray 100 in-line after mounting; process automation can be achieved through inline carrier mounting based on the characteristics of the manufacturing process (injection molding, coating, electroplating, etc.).

The card tray assembly 200 may comprise a card tray 100 and a carrier body 210. The card tray 100 was described above, and its description is therefore omitted here.

The carrier body 210 has an overall rectilinear shape, and is formed with a tray mounting hole 211a or mounting recess in the center, where the card tray 100 is mounted. In addition, the tray connecting part 211 is formed to protrude into the tray mounting hole 211a or mounting recess of the carrier body 210, so as to connect to the card tray 100.

The invention claimed is:

1. A card tray for an electronic device, the card tray comprising:
   a tray body formed of a non-metallic material, the tray body having a front end part, the front end part defining a front surface and opposite side surfaces; and
   a metal frame part which is coupled to the tray body, the metal frame part having a frame body, the frame body having a front portion which protrudes outwardly from the front surface of the front end part of the tray body, the frame body having side portions which protrude outwardly from the side surfaces of the front end part of the tray body, the front and side portions of the frame body being integrally formed with one another such that the front and side portions of the frame body are generally U-shaped in configuration, wherein the metal frame part is insert-molded on the tray body.

2. The card tray as defined in claim 1, wherein the front and side portions of the frame body have a configuration which directly corresponds to a configuration of the front and side surfaces of the front end part of the tray body.

3. The card tray as defined in claim 1, wherein the front and side portions of the frame body are located on a top of the front end part of the tray body.

4. The card tray as defined in claim 1, wherein the front and side portions of the frame body are located on a bottom of the front end part of the tray body.

5. The card tray as defined in claim 1, wherein the front and side portions of the frame body are located in a middle of the front end part of the tray body.

6. A tray carrier assembly, comprising:
- a card tray for an electronic device, the card tray having a tray body and a metal frame part, the tray body being formed of a non-metallic material, the tray body having a front end part, the front end part defining a front surface and opposite side surfaces, the metal frame part being coupled to the tray body, the metal frame part having a frame body, the frame body having a front portion which protrudes outwardly from the front surface of the front end part of the tray body, the frame body having side portions which protrude outwardly from the side surfaces of the front end part of the tray body, the front and side portions of the frame body being integrally formed with one another such that the front and side portions of the frame body are generally U-shaped in configuration; and
- a carrier body defining a tray mounting hole, the card tray being mounted to the carrier body, the carrier body defining at least one tray connecting part protruding into the tray mounting hole, the at least one tray connecting part being connected to the metal frame part.

7. The tray carrier assembly as defined in claim 6, wherein the at least one tray connecting part is connected to the front portion of the frame body.

\* \* \* \* \*